United States Patent
Malinoski et al.

(10) Patent No.: US 6,389,225 B1
(45) Date of Patent: May 14, 2002

(54) APPARATUS, METHOD AND SYSTEM OF LIQUID-BASED, WIDE RANGE, FAST RESPONSE TEMPERATURE CONTROL OF ELECTRONIC DEVICE

(75) Inventors: Mark F. Malinoski; Thomas P. Jones; Brian Annis, all of Westerville; Jonathan E. Turner, Lewis Center, all of OH (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 09/352,762

(22) Filed: Jul. 14, 1999

Related U.S. Application Data

(60) Provisional application No. 60/092,715, filed on Jul. 14, 1998.

(51) Int. Cl.[7] ................................................. F24H 1/10
(52) U.S. Cl. ....................... 392/479; 438/122; 219/494
(58) Field of Search .......................... 392/479; 219/494, 219/497; 438/5, 22, FOR 413

(56) References Cited

U.S. PATENT DOCUMENTS

| | | | |
|---|---|---|---|
| 3,710,251 A | 1/1973 | Hagge et al. ............... 324/158 |
| 3,922,527 A | 11/1975 | Witkin et al. ............... 219/494 |
| 3,971,876 A | 7/1976 | Witkin et al. ................. 13/31 |
| 4,066,868 A | 1/1978 | Witkin et al. ............... 219/486 |
| 4,324,285 A | 4/1982 | Henderson ..................... 165/2 |
| 4,330,809 A | 5/1982 | Stanley ....................... 361/103 |
| 4,604,572 A | 8/1986 | Horiuchi et al. ......... 324/158 F |
| 4,637,020 A | 1/1987 | Schinabeck .................. 371/20 |
| 4,686,627 A | 8/1987 | Donovan et al. ........... 364/481 |
| 4,713,612 A | 12/1987 | Takamine .................... 324/158 |
| 4,734,872 A | 3/1988 | Eager et al. ................ 364/557 |

(List continued on next page.)

FOREIGN PATENT DOCUMENTS

| | | |
|---|---|---|
| DE | 35 36098 | 4/1987 |
| WO | 94/22029 | 9/1994 |
| WO | 98/05060 | 2/1998 |

OTHER PUBLICATIONS

Tustaniwskyj, Jerry I., et al. Constant Temperature Control of a Device Under Test (DUT)–Part 1, Development Services Organization, Unisys Corporation, San Diego, CA, pp. 1–6.

"Patent Abstracts of Japan", *Electric Apparatus Cooling Circuit*, Application No. 08072841, (Mar. 27, 1996).

Abstract of Warisaya Kanji, 09264647, (Oct. 7, 1997).

*Primary Examiner*—Teresa Walberg
*Assistant Examiner*—Thor Campbell
(74) *Attorney, Agent, or Firm*—Foley & Lardner

(57) ABSTRACT

An active temperature control system for a DUT utilizes a heat sink containing HFE7100 liquid and an electric heater. The liquid is cooled below the set point and the heater is used to bring the DUT up to the set point. Set points in the range of –10 degrees C. to +110 degrees C. can be achieved. The heat sink utilizes only a single coolant for all of the set points, allowing set points to be changed within a few minutes. At a given set point, the heater provides a quick response to offset the effect of self-heating and keep the set point deviation to within a few degrees C. Power following techniques can be utilized to achieve the quick response.

24 Claims, 13 Drawing Sheets

U.S. PATENT DOCUMENTS

| | | | |
|---|---|---|---|
| 4,744,408 A | 5/1988 | Pearson et al. ................ 165/2 |
| 4,777,434 A | 10/1988 | Miller et al. ............. 324/158 F |
| 4,784,213 A | 11/1988 | Eager et al. .................... 165/2 |
| 4,881,591 A | 11/1989 | Rignall ....................... 164/26 |
| 4,926,118 A | 5/1990 | O'Connor et al. ....... 324/158 F |
| 5,006,796 A | 4/1991 | Burton et al. ............ 324/158 F |
| 5,084,671 A | 1/1992 | Miyata et al. .............. 324/158 |
| 5,099,908 A | 3/1992 | Taraci et al. ................... 165/1 |
| 5,126,656 A | 6/1992 | Jones .................... 324/158 F |
| 5,143,450 A | 9/1992 | Smith et al. .................. 374/12 |
| 5,164,661 A | 11/1992 | Jones .................... 324/158 F |
| 5,172,049 A | 12/1992 | Kiyokawa et al. ....... 324/158 F |
| 5,177,435 A | 1/1993 | Kiyokawa et al. ....... 324/158 F |
| 5,205,132 A | 4/1993 | Fu ............................. 62/208 |
| 5,233,161 A | 8/1993 | Farwell et al. .............. 219/209 |
| 5,263,775 A | 11/1993 | Smith et al. ................ 374/134 |
| 5,287,292 A | 2/1994 | Kenny et al. ............... 364/550 |
| 5,297,621 A | 3/1994 | Taraci et al. ........... 165/104.13 |
| 5,309,090 A | 5/1994 | Lipp ...................... 324/158 R |
| 5,315,240 A | 5/1994 | Jones .................... 324/158 F |
| 5,324,916 A | 6/1994 | Goto et al. ................. 219/497 |
| 5,332,884 A | 7/1994 | Bailey ........................ 219/494 |
| 5,359,285 A | 10/1994 | Hashinaga et al. ...... 324/158.1 |
| 5,369,245 A | 11/1994 | Pickering ................... 219/209 |
| 5,381,087 A | 1/1995 | Hirano .................... 324/158.1 |
| 5,420,521 A | 5/1995 | Jones ........................ 324/760 |
| 5,457,400 A | 10/1995 | Ahmad et al. .............. 324/763 |
| 5,552,744 A | 9/1996 | Burlison et al. ............ 327/401 |
| 5,569,950 A | 10/1996 | Lewis et al. ................ 257/467 |
| 5,582,235 A | 12/1996 | Hamilton .................... 165/263 |
| 5,614,837 A | 3/1997 | Itoyama et al. ............. 324/760 |
| 5,648,728 A | 7/1997 | Canella ...................... 324/755 |
| 5,821,505 A | 10/1998 | Tustaniwskyj et al. ..... 219/494 |
| 5,844,208 A | 12/1998 | Tustaniwskyj et al. ..... 219/494 |
| 5,847,293 A | 12/1998 | Jones ........................ 73/865.8 |
| 5,864,176 A | 1/1999 | Babock et al. .............. 257/714 |
| 5,894,217 A | 4/1999 | Igarashi et al. .......... 324/158.1 |

FIG. 5

APPARATUS, METHOD AND SYSTEM OF LIQUID-BASED, WIDE RANGE, FAST RESPONSE TEMPERATURE CONTROL OF ELECTRONIC DEVICE

CROSS-REFERENCE TO RELATED APPLICATION

This application claims the priority of, and hereby incorporates by reference as if fully set forth herein, previously filed provisional application No. 60/092,715, filed on Jul. 14, 1998.

BACKGROUND OF THE INVENTION

1. Field of the Invention

This invention relates to temperature control systems which maintain the temperature of an electronic device near a given set point temperature(s) while the device is being operated or tested. Two specific examples of electronic devices which need to be operated or tested at a constant temperature are packaged integrated chips and unpackaged bare chips.

2. Description of the Related Art

Maintaining the chip temperature near a given set point is not difficult if the power dissipation of the chip is constant or varies in a small range while operating or testing. In such cases, it is only necessary to couple the chip through a fixed thermal resistance to a thermal mass which is at a fixed temperature. But if the instantaneous power dissipation of the chip varies up and down in a wide range while operating or testing, then maintaining the chip temperature near a constant set point is very difficult. When chips are being debugged or tested, it is advantageous to evaluate their performance at a variety of temperatures, ranging from cold to hot. Combining the ability to force temperature across a wide temperature range, while accommodating the temperature changes associated with varying instantaneous power dissipation, is very challenging.

Typical approaches to solve this problem involve forced air convection systems that extend well beyond the desired forcing temperature range at both the hot and cold ends. In this way, an attempt can be made to accelerate the chip's temperature conditioning by overcooling or overheating. As the nominal power density of the chips continue to increase, the ability of forced air convection systems to overcool reaches practical limits, causing increases in the temperature error between the desired and actual temperatures relative to set point. Another problem is that chips fabricated in the latest processes have an increased sensitivity to high temperatures. The potential for chip damage due to overheating adds risk to the use of the overheating approach. Increased time to set point is the result, with lost utilization of expensive test equipment and engineering personnel as an expense.

Another approach is the use of dual liquid conduction systems, with one hot and one cold liquid. The proportion of the liquids are mechanically metered to affect the desired forcing temperature. To achieve fast response times, this approach requires that the metering occur very close to the chip. This imposes mechanical packaging constraints which limit the flexibility to bring the surface of the temperature forcing system control surface into contact with the chip or chip package. Even so, the mechanical metering of the dual liquids is much slower to affect a change in the forcing temperature when compared to the temperature changes induced by the chip's instantaneous power dissipation. This also causes increased error between the desired and actual temperatures.

The present invention is directed to overcoming or at least reducing the effects of one or more of the problems set out above.

SUMMARY OF THE INVENTION

This invention combines the optimal liquid and liquid temperature control system with a heat exchanger. A single liquid is used to cover as much of the temperature range as possible. Modes of the control of the heating element are then used to extend the set point temperature range which the temperature forcing system contact surface can apply. In one embodiment of the invention, the flow rate of the liquid through the heat exchanger is metered, to optimize the power dissipation of the heat exchanger, versus the desired thermal control performance at the chip.

The present invention provides a liquid based, wide range, fast response chip temperature control system. The wide temperature range is achieved by extending the effective temperature range of a liquid based coolant loop with resistive heating in the control surface. In this way, the desired temperature range for testing chips can be achieved, while supplying the features of: (i) fast set point temperature change, (ii) response to instantaneous power dissipation changes, and (iii) small form factor and flexibility in chip situations.

This system may include: (i) the liquid cooling and recirculation system, (ii) the thermal control circuit which controls the heater temperature, (iii) the algorithms contained in the thermal control circuit which perform the translation from a desired device temperature to a heater control, and (iv) the heat exchanger consisting of a liquid cooled heat sink and a resistive heater bonded to it, which contacts the chip.

Briefly, there is provided according to one embodiment of the present invention an apparatus for controlling a temperature of a device. The apparatus includes a heater, a heat sink, and a temperature control system. The temperature control system is adapted to move the temperature of the point on the heater from approximately a first set point temperature to approximately a second set point temperature.

Briefly, there is provided according to another embodiment of the present invention an apparatus for controlling a temperature of a device. The apparatus includes a heater, a heat sink, and a temperature control system. The temperature control system is adapted to move the temperature of the point on the device from approximately a first set point temperature to approximately a second set point temperature.

Briefly, there is provided according to another embodiment of the present invention an apparatus for controlling a temperature of a device. The apparatus includes a heater, a heat transfer unit, and a temperature control system. The temperature control system is adapted to move the temperature of the point on the device by at least 50 degrees C. by controlling power sent to the heater and by controlling a temperature of a surface of the heat transfer unit.

Briefly, there is provided according to another embodiment of the present invention an apparatus for controlling a temperature of a device. The apparatus includes a heater, a heat sink, and a temperature control system. The temperature control system is coupled to both the heater and the heat sink and is adapted to maintain a temperature of a point on the device at or near a set point temperature despite the existence of self-heating of the device.

Briefly, there is provided according to another embodiment of the present invention an apparatus for controlling a temperature of a semiconductor device during testing. The apparatus includes a heat exchanger and a temperature control system. The heat exchanger is adapted to be thermally coupled to the semiconductor device during testing. The temperature control system is coupled to the heat exchanger and is for controlling the heat exchanger. The temperature control system is adapted to maintain the temperature of the semiconductor device at or near a set point temperature during testing despite self-heating of the semiconductor device. The set point temperature can be set to a first value or to a second value which is at least 25 degrees Celsius lower.

Briefly, there is provided according to another embodiment of the present invention a method of controlling a temperature of a semiconductor device during testing. The method includes moving the temperature of the device to approximately a first set point temperature. The method further includes moving the temperature of the device to approximately a second set point temperature.

Briefly, there is provided according to another embodiment of the present invention an apparatus for controlling a temperature of a semiconductor device. The apparatus includes a heat exchanger, a gas injection fitting, and a temperature control system. The gas injection fitting is for injecting a gas into a contact region between the heat exchanger and the semiconductor device when the semiconductor device is contacting the heat exchanger.

BRIEF DESCRIPTION OF THE DRAWINGS

FIG. 5 shows an example profile setup screen.

DETAILED DESCRIPTION OF THE PREFERRED EMBODIMENT

1. System Overview

Figure 1:
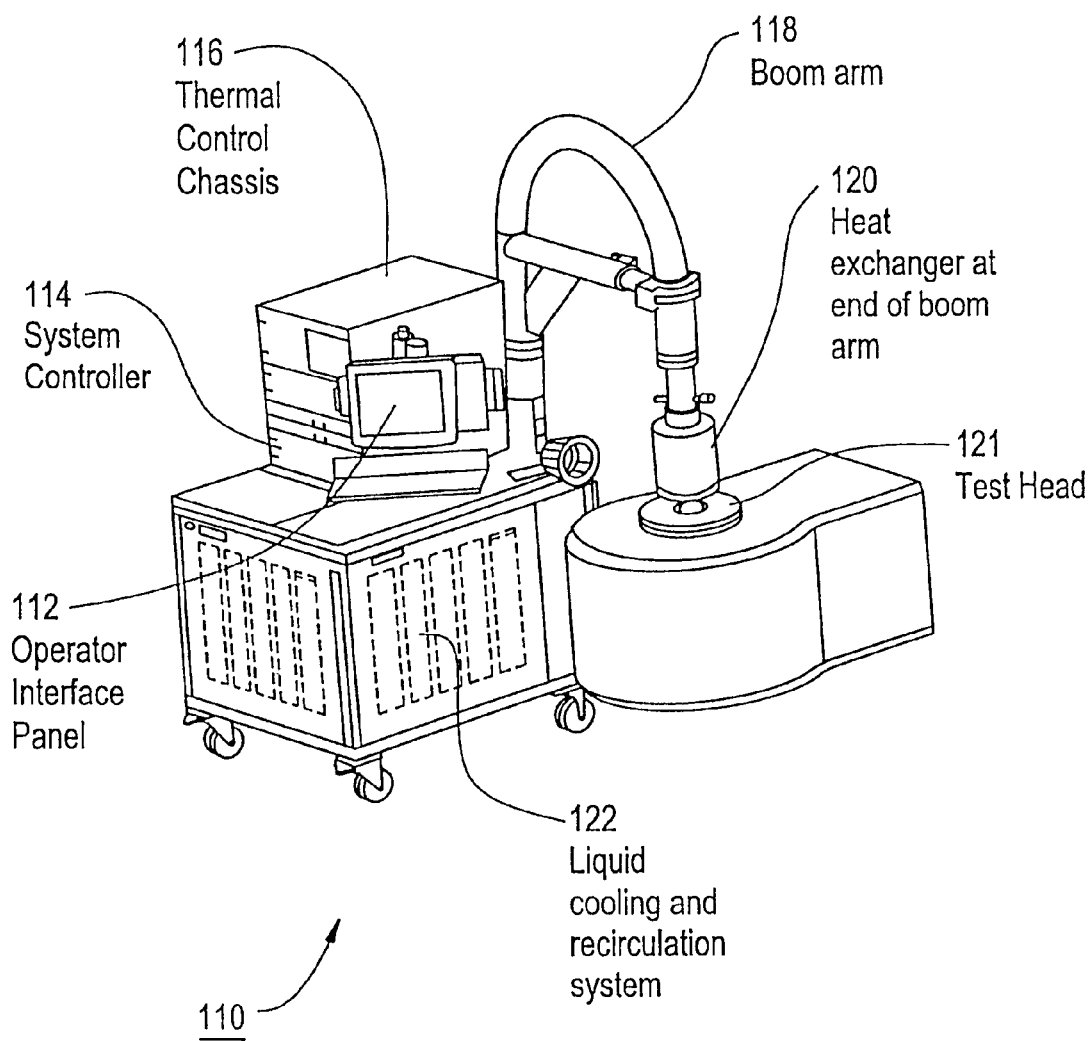
FIG. 1 illustrates a general diagram of the system.

FIG. 1 shows a general diagram of a system 10 according to the present invention. As shown, the user operates the system 10 at the operator interface panel 12. The operator interface panel 12 serves as an interface to the system controller 14. The system controller 14 is housed in the system electronics enclosure 16 and controls the heat exchanger 20 and the liquid cooling and recirculation system 22. The system electronics enclosure 16 also contains the thermal control chassis 11 immediately under the system controller 14. The two thin modules below the thermal control chassis 11 are high voltage power supplies 13, although one embodiment uses one large one instead of two small ones. The bottom module is the low voltage power supply 15.

The heat exchanger 20 preferably includes a heater and a heat sink. Other heat exchangers are possible, however. The heat sink preferably contains a chamber through which the liquid is pumped. Other heat sinks are also possible. Heat sinks, or heat sink systems, with no liquid are also viable if the thermal conductivity is high enough. In particular, solid heat sinks such as Peltier devices are known in the art which use electrical signals through the material to control temperature and temperature gradients. A heat sink may also equivalently be referred to as a heat transfer unit, thus focusing attention on the fact that the heat sink may also act as a heat source.

The heater of the preferred embodiment is a resistive heater. However, it is to be understood that many other types of heaters can also be used, including without limitation a heater utilizing lasers, other optics, or electromagnetic waves.

It is also to be understood that a typical heater, or heat sink, will have a temperature gradient across the surface. In the case of a heater, the existence of a gradient is due, in part, to the fact that the heating element usually occupies only a portion of the heater.

The liquid cooling and recirculation system 22 supplies a liquid to the heat exchanger 20, specifically to the heat sink, through the boom arm 18. The boom arm 18 also carries the control signals from the system controller 14 and the thermal control chassis 11 to the heater.

A test head 21 is adapted to be positioned under the heat exchanger 20. The test head 21 preferably contains a test socket which is used for mating with a device under test ("DUT") such as a chip.

Figure 2:
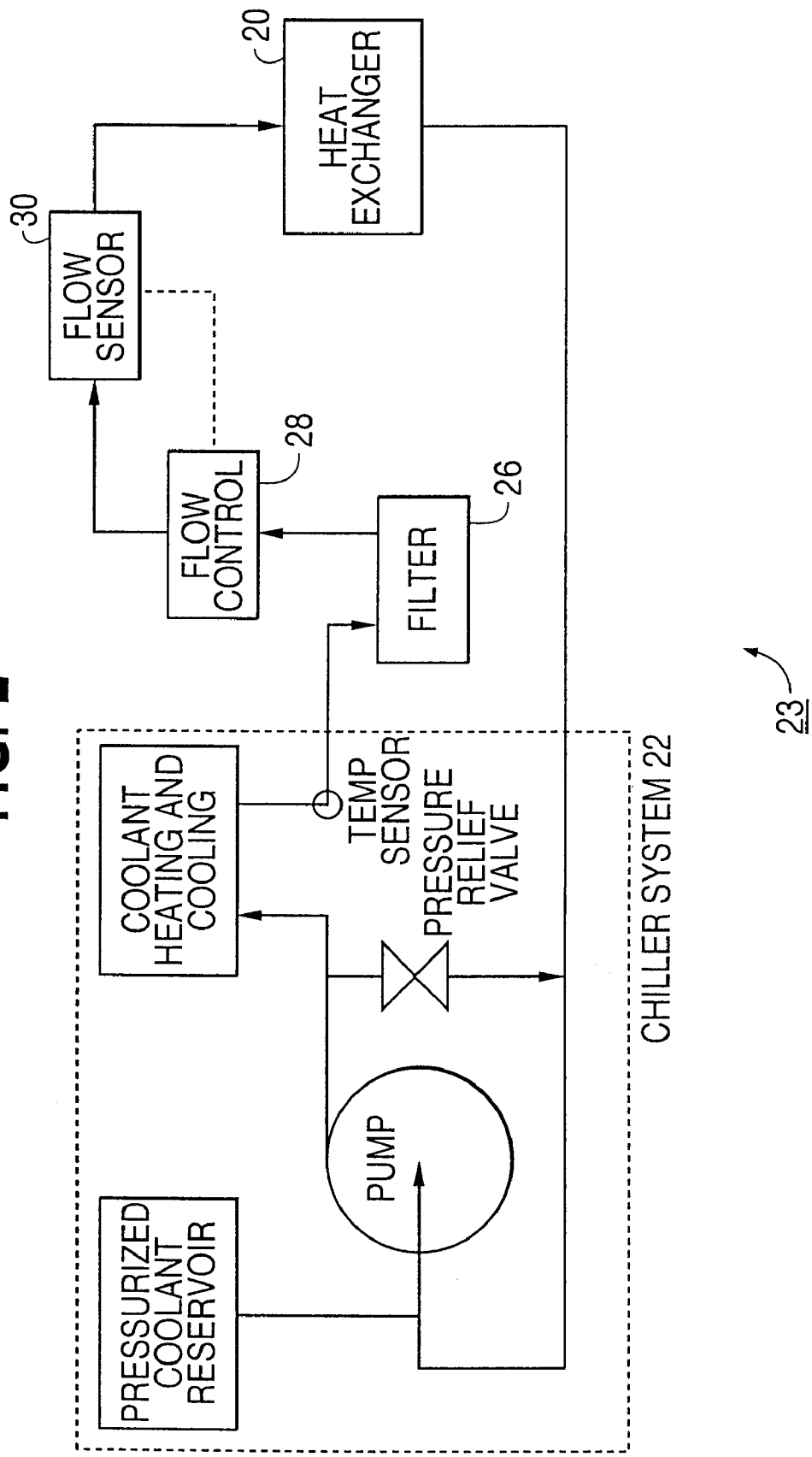
FIG. 2 illustrates a schematic for a liquid coolant system, according to one embodiment of the present invention.

FIG. 2 shows a general schematic 23 for a coolant system which may be used with the present invention. The block diagram of a chiller system 22 may be used for implementing the liquid cooling and recirculation system 22 of FIG. 1. The chiller system 22 pumps the liquid through a filter 26, a flow control 28, a flow sensor 30, and finally to the heat exchanger 20. The liquid then returns to the chiller system 22 to be cooled and pumped back through the system. In the embodiment shown in FIG. 1, both the forward and return paths for the liquid go through the boom arm 18 (of FIG. 1).

Figure 10:
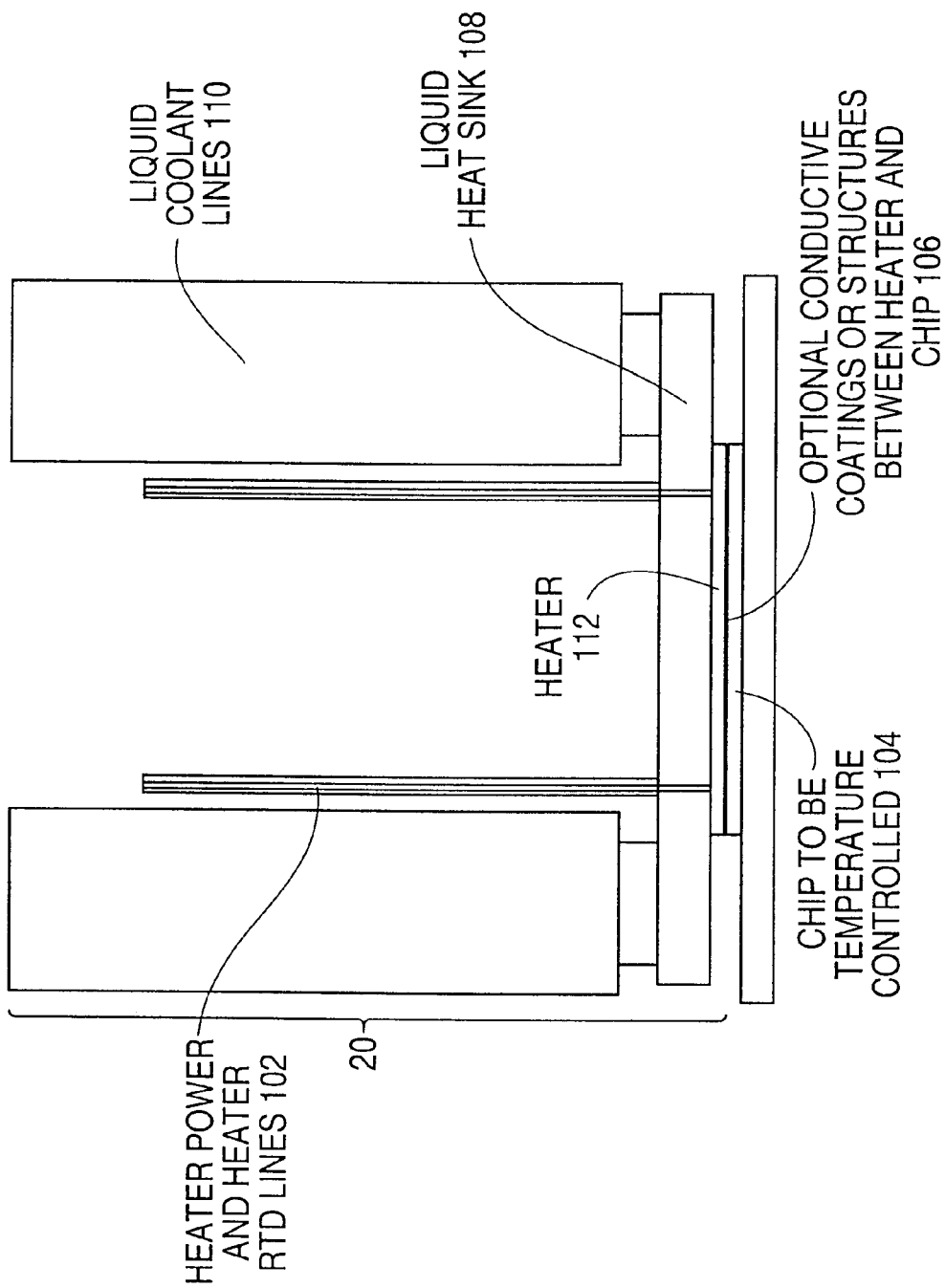
FIG. 10 depicts a heat exchanger with optional conductive coatings or structures.

FIG. 10 shows, among other things, an embodiment in which a heat exchanger 20 is attached to a DUT 104. The heat exchanger 20 comprises a heater 112, a heat sink 108, heater power and heater RTD lines 102, and liquid coolant lines 110. The heater 112 is flush against a surface of the heat sink 108 which is attached to a heat sink 108. The liquid coolant lines 110 supply liquid to the liquid heat sink 108. The lines 102 supply power to the heater 112. The device 104 whose temperature is to be controlled is disposed beneath and in contact with a bottom surface of the heater 112.

FIG. 10 also shows optional conductive coatings and structures 106 which may be placed on the heater 112 to improve the thermal conductance to the chip 104. This approach improves the thermal conductance between the heater 112 and the chip 104 when compared to a trapped layer of air. Improving this thermal conductance then improves the chip temperature control performance. For a given power envelope of a DUT, the improved thermal conductance lowers a required temperature difference between a heat sink and a set point, as more fully explained later.

Figure 11:
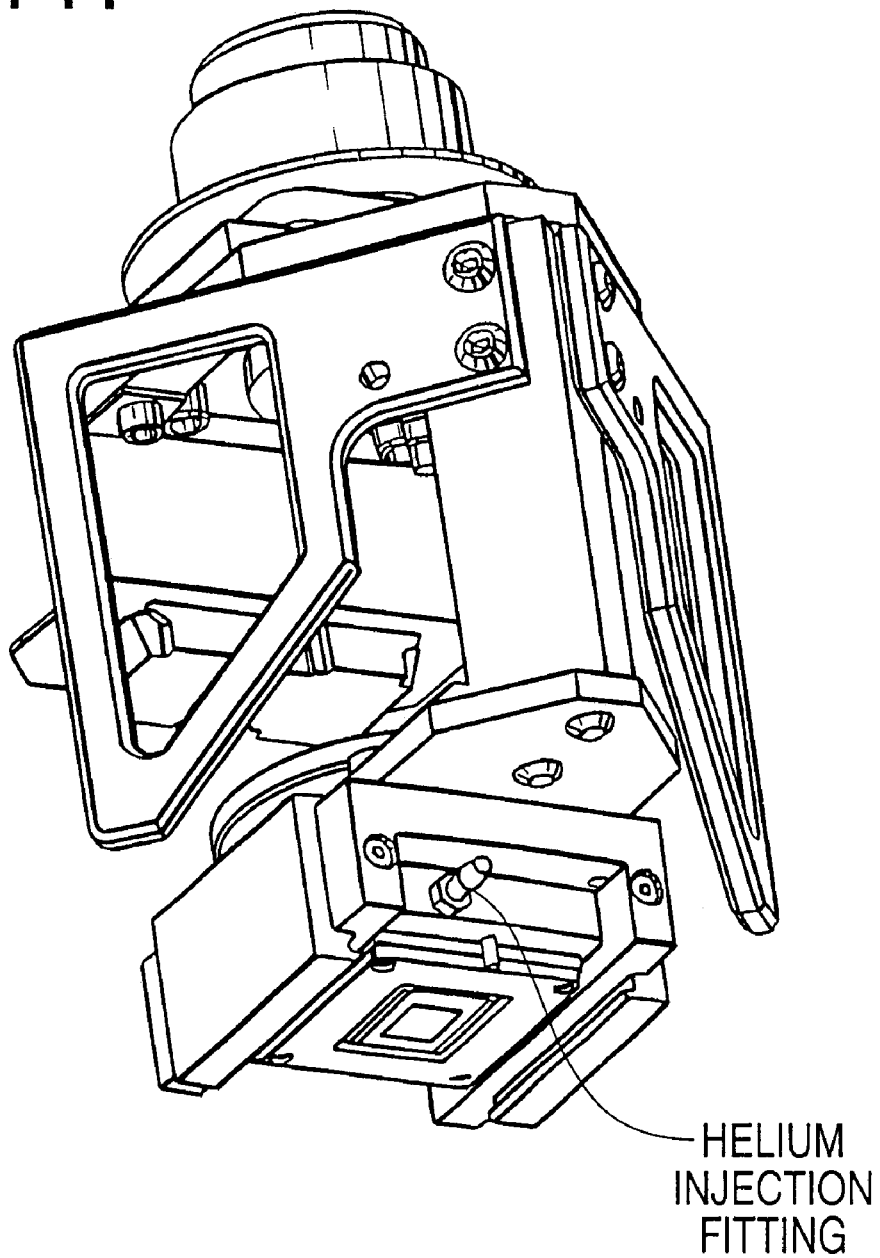
FIG. 11 shows a socket assembly plumbed for helium injection.

Optionally, the socket assemblies used to receive the chip are plumbed to allow for helium gas to be injected. This allows for helium to displace the air between the heater and the chip. Helium is more thermally conductive than air, improving the thermal control performance. FIG. 11 illustrates an embodiment of a socket assembly plumbed for Helium injection. The helium flow can be controlled in a variety of ways known to one of ordinary skill in the art. One embodiment is for a control system to control the flow during actual testing of a device.

Figure 7:
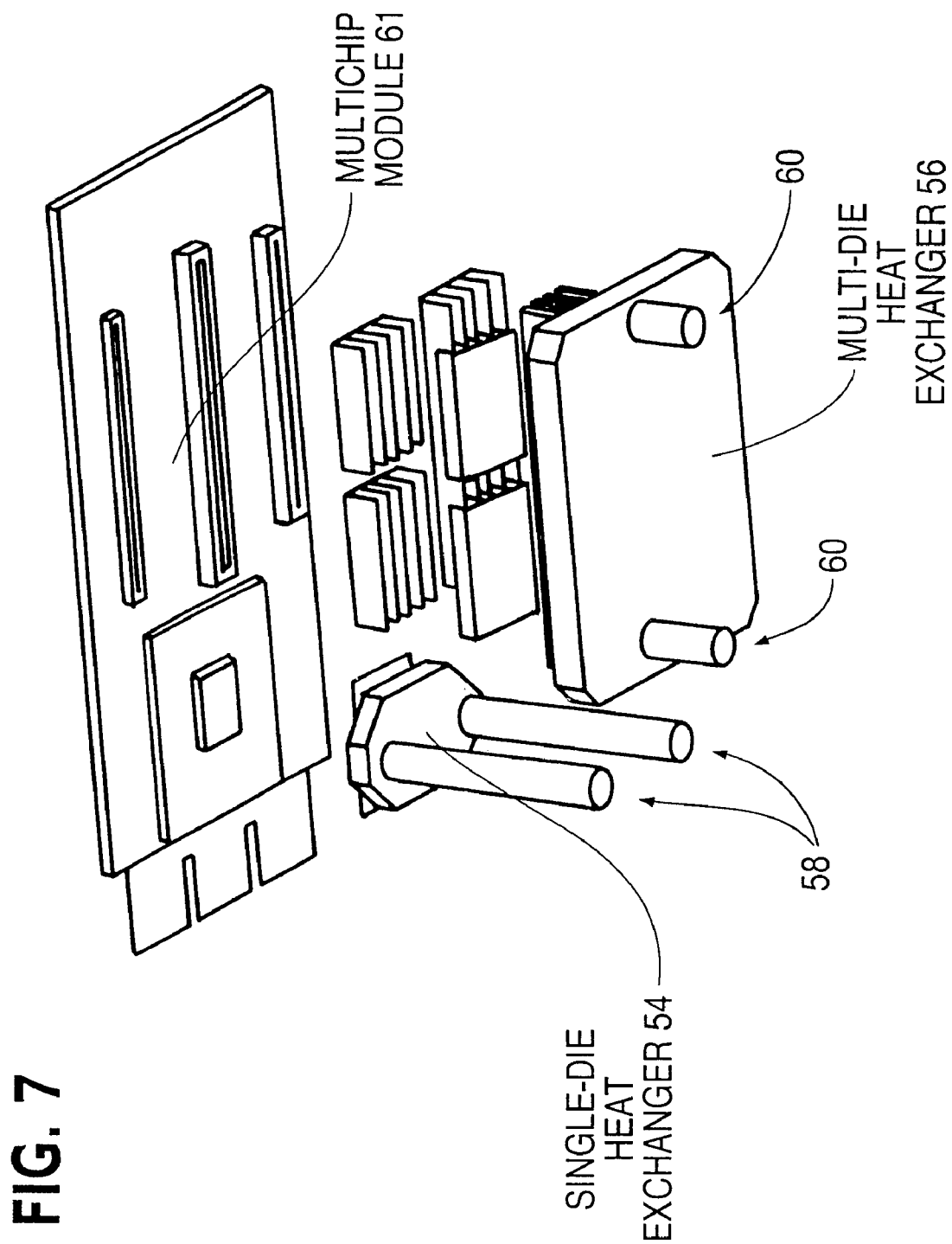
FIG. 7 depicts multiple heat exchangers on a multi-chip module.

FIG. 7 illustrates an alternative embodiment in which multiple heat exchangers are utilized. Referring to FIG. 7, heat exchanger 54 and heat exchanger 56 have separate inlets and outlets 58, 60. This allows the two heat exchangers to be separately controlled and maintained at separate temperatures, if desired, using a single chiller (see FIG. 2, element 22) and separate flow control for each heat exchanger (see FIG. 2, elements 28 and 30). Preferably, each sub-system includes separate heaters attached to the separate heat sinks in the manner illustrated in FIG. 10. In such an embodiment, the heaters are each controlled separately. There are also embodiments that allow two separate heaters to be controlled by a single thermal control channel.

Alternatively, the separate inlets and outlets 58, 60 are connected to the same coolant system and the two heat exchangers 54, 56 operated with liquid coolant which is at the same temperature in each heat exchanger. With separate heaters attached to the heat exchangers the separate dies may still be operated at different temperatures.

In yet a further alternative, a single coolant system is used for multiple DUTs, such as a multi-chip module 61, and the multi-die heat exchanger 56 is utilized. The multi-die heat exchanger 56 can have separate heaters interposed between it and the respective DUTs of the multi-chip module 61.

In yet a further alternative, a single coolant system is used for multiple heat exchangers, and in-line heaters are installed in the coolant supply line (between elements 30 and 20 of FIG. 2) to raise the temperature of the coolant being supplied to one or more heat exchangers separately, to further increase the temperature control capability.

Figure 6:
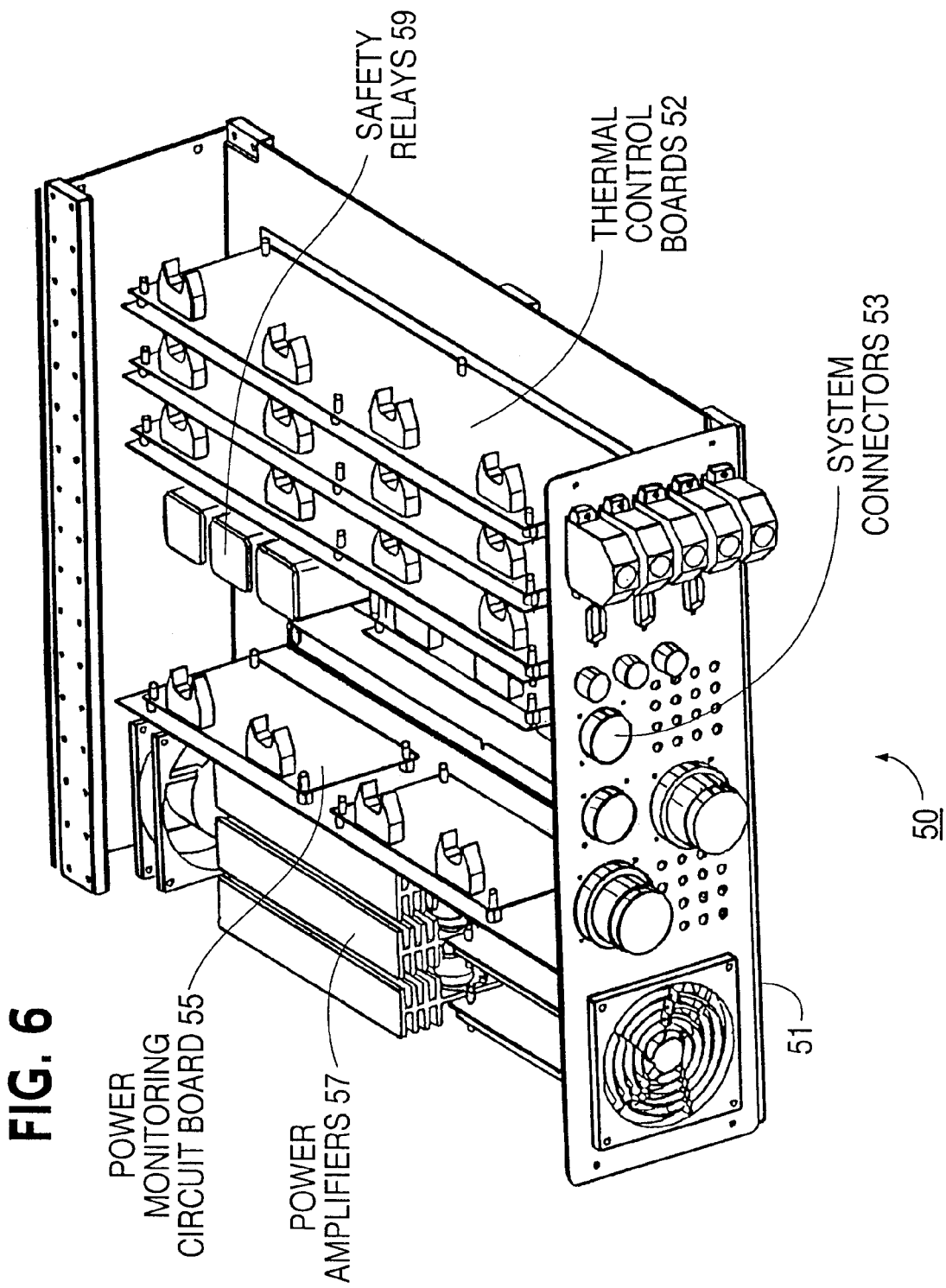
FIG. 6 illustrates a three channel thermal control subsystem.

Separate control is accomplished by expanding the number of control loops. This can be achieved by adding additional instances of the thermal control circuitry to the system. This enables the thermal control of individual chips of a multi-chip module. FIG. 6 illustrates an embodiment of a thermal control chassis 51, capable of housing thermal control boards 52 for three control loops. FIG. 6 contains a picture of a three channel thermal control sub-system 50. The system 50 includes a chassis 51 which includes three thermal control boards 52, safety relays 59 (which are part of the self-test functionality in the electronics enclosure 16 and are used to test the integrity of the heater and RTD traces), three power monitoring circuit boards 55, and three power amplifiers 57. FIG. 6 shows various other components, including system connectors 53, which are standard for a chassis housing electronic equipment.

Figure 3:
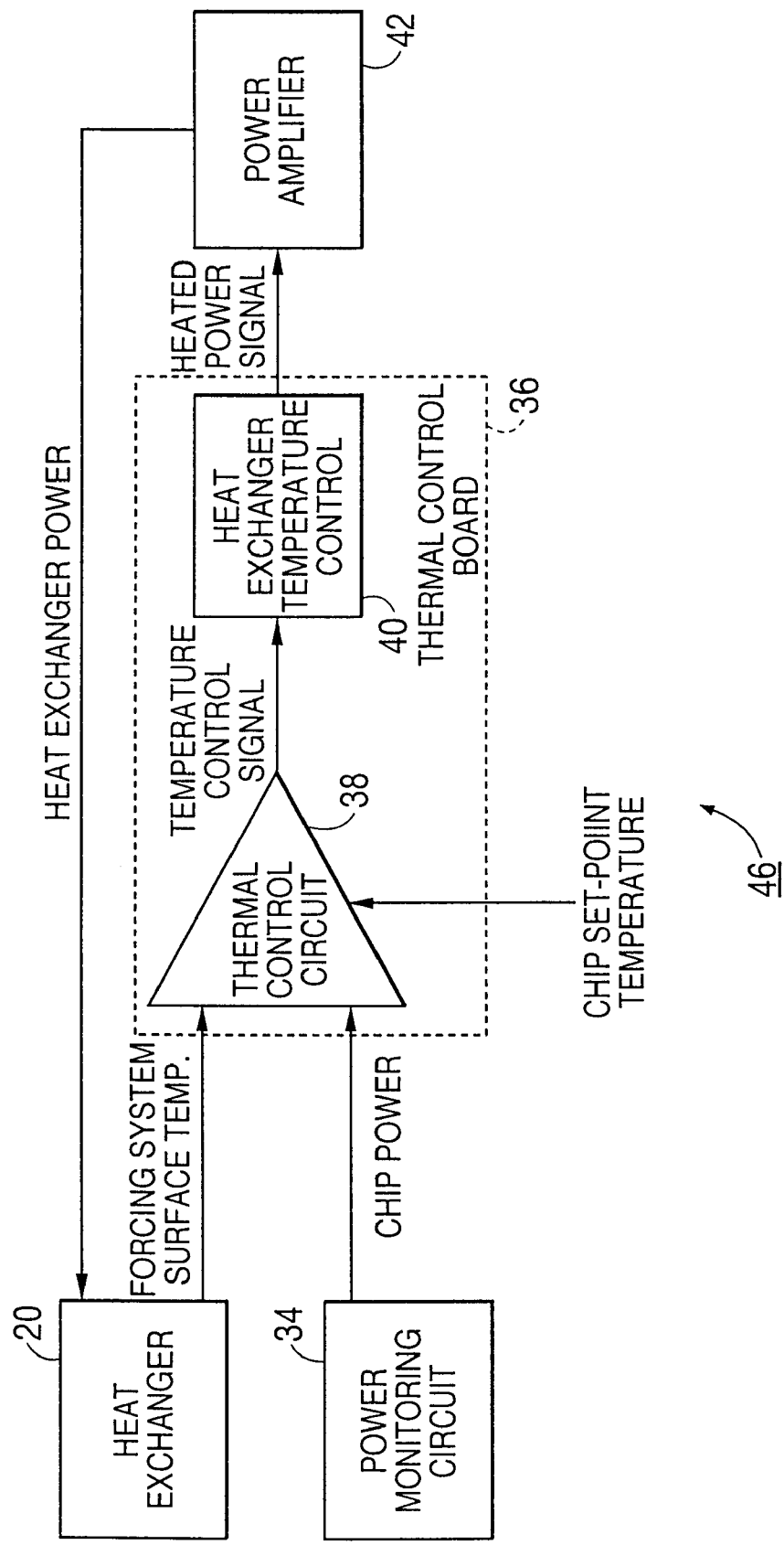
FIG. 3 illustrates a high level schematic of the control electronics for one thermal control channel.

FIG. 3 shows a high level schematic 46 of the control electronics for a thermal control channel such as a thermal control board 52 of FIG. 6. The schematic 46 can be applied to the control of a heater in a heat exchanger 20. The general operation of the schematic 46 is described below, and details of this schematic for a particular embodiment can be found in an application by Jones which is discussed in a later section of this disclosure.

Briefly, in one embodiment, the power monitoring circuit 34 of FIG. 3 monitors the power used by a chip (not shown) and supplies an indication of that power to the thermal control board 36. The thermal control circuit 38 accepts this input. The thermal control circuit 38 also accepts as an input the temperature of a forcing system, which is, for example, the temperature of the heater surface (not shown) which is in contact with the chip. The thermal control circuit 38 then computes a thermal control signal which is sent to the heat exchanger temperature control 40. The heat exchanger temperature control 40 determines a heater power signal and sends it to a power amplifier 42 which in turn sends a heat exchanger power signal to the heat exchanger 20. In this embodiment, the thermal control board 36 computes a signal that controls a heater, which is part of the heat exchanger 20.

As stated earlier in the description of FIG. 1, the heat exchanger 20 preferably includes a heat sink which contains a chamber through which a liquid is pumped. Ideally, the liquid in the heat sink must: (i) have a low and relatively flat viscosity over the required temperature range so that it can be pumped; (ii) have a thermal capacity which is high enough over the required temperature range so that it can serve as an efficient heat exchange medium; (iii) be a safe chemical so that no injuries will result if any part of the human body is exposed to the liquid; and (iv) be a dielectric, meaning that the liquid will not electrically short any circuit onto which it might be spilled. Ideally, the minimum temperature range for the first of these two characteristics extends from approximately 40 or 60 degrees C. down to approximately −40 degrees C.

It has been determined that a liquid (HFE7100) meets all of the above requirements. HFE7100 is a specialty liquid manufactured by 3M corporation. HFE7100 contains ethyl nonafluorobutylether and ethyl nonafluoroisobutylether. Preferably, HFE7100 is used at normal strength. HFE7100 is non-toxic, non-explosive, non-conductive electrically, and is a safe liquid as compared to other alternatives. As an alternative, water can be used with additives, such as methanol or ethylene glycol. However, such a mixture is potentially explosive, poisonous, and has a high viscosity at low temperatures. Further, it is difficult to achieve set points below 15 degrees C. with such water based liquids. Additionally, it is difficult to maintain set points below roughly 60 degrees C. for devices which self-heat (see above discussion of FIG. 8).

The HFE7100 liquid meets the requirements for a minimum temperature range of from approximately −40 degrees C. to approximately +40 or +60 degrees C. The liquid boils at roughly 60 degrees C. Other liquids, without similar thermal, physical, environmental, and dielectric properties, are typically only operable in a more restricted range, for example at low temperatures or at high temperatures but not both. Therefore, a heat sink chamber would have to be drained and flushed and then filled with a different liquid mixture for operating at different temperatures. HFE7100, however, can typically be used for set points, as differentiated from the liquid temperature, in an approximate range of −10 to +110 degrees C. Further, the limits on the temperature range of HFE7100 can be extended in both directions with different chillers. Other products, including new HFE products by 3M, which have similar thermal, physical, environmental, and dielectric properties, can serve as alternatives to HFE7100. Other alternatives may exist or may be introduced into the market-place that allow the temperature range to be extended even further (similar heat capacity and viscosity at lower coolant temperatures to achieve lower setpoints, and/or a higher boiling point to achieve higher setpoints).

One embodiment uses a chiller which is not pressurized and which can only bring the liquid down to −40 degrees C. An alternate chiller could cool the liquid further and/or pressurize the liquid to allow it to be heated further as well. The current temperature range of the chiller is sufficient to achieve the desired set points when operated with a heater which can maintain a temperature differential of roughly 90 degrees C. One embodiment uses such a heater.

A preferred chiller can bring the temperature of the liquid from −40 degrees C. up to +40 degrees C. in about five minutes. This time increases as the amount of coolant increases and as the thermal mass of the coolant system and the plumbing increases. Thus, larger systems will take longer to move the temperature of the coolant.

An embodiment uses a vacuum at the return side to produce a negative pressure coolant loop. Such an embodiment has better leak tolerance in that it accumulates air in the system instead of spraying liquid from the system. Preferably the system is built with quick disconnect capability, thus precluding the possibility of welding the system and virtually eliminating leaks. Embodiments may also use a slightly positive pressure to increase the flow rate. Such positive pressures, however, do not significantly affect the boiling point of the liquid.

2. System Operation

The preferred embodiment controls the temperature of a device 104 using a liquid-based heat sink 108 coupled to a heater 112, as shown in FIG. 10. The fluid, in the liquid coolant lines 110, cooling the heat sink 108 is typically kept at a roughly constant temperature below the set point while the heater 112 is used to bring the device temperature up to the set point. Thus, the coolant and the heater 112 are operated at different temperatures. The heater 112 is further used to effect quick changes in temperature control to accommodate and compensate for quick changes in the device 104 due to self-heating, for example. Many techniques can be used to accomplish the necessary active control of the heat exchanger 20.

A. Control System

Co-pending patent application U.S. Ser. No. 08/734,212 to Pelissier, filed on Oct. 21, 1996, and assigned to the present assignee, and previously filed provisional application No. 60/092,720 to Jones, et al., assigned to the present assignee, filed on Jul. 14, 1998, are both hereby incorporated by reference as if fully set forth herein. Pelissier and Jones describe using power usage of an electronic device under test to control the temperature of the electronic device. Such methods may be used to accomplish or assist in the control of the temperature using the present invention. Additionally, temperature following methods, or any other type of active temperature control, may also be used with the preferred embodiment of the present invention.

Referring to FIG. 3, the thermal control board 36 performs a variety of functions. Generally speaking, a thermal control board must process input information related to the device temperature, and then determine how to adjust the heat exchanger to maintain the DUT at the desired set point. Such information can include without limitation the actual temperature of the DUT, the power consumed by the DUT, the current consumed by the DUT, the 'predicted' power of the DUT in a Feed Forward arrangement, or an indicator of the DUT temperature. A power profile, created for a particular device, can also be used as an input which is related to the temperature of the particular device. The use of power profiles is described, for example, in the Pelissier and Jones applications mentioned earlier. Indicators of the temperature can be derived from a thermal structure such as, for example, thermal diodes or resistors in the DUT. Note that the input information related to the device temperature may have information related to the absolute or relative position, velocity, and/or acceleration of the actual chip temperature. A thermal control board may be implemented in a variety of methods, including analog or digital circuitry as well as software. This applies both to the processing operations associated with accepting the inputs and making the necessary calculations, as well as to the control of the heat exchanger temperature. A variety of control techniques may also be used to achieve a controller with a desired combination of proportional, integral, and/or derivative control features.

The control of the heater is the principal task of the temperature control system. The fluid in the heat sink must also be controlled by setting the temperature and the flow rate of the liquid. These settings, however, do not typically need to be changed during a test at a given set point and many different settings are possible. Typical applications often use a flow rate of 0.5–2.5 liter/min, but this is largely a function of the heat exchanger design for the application. This range of flow rates is often varied across the temperature range, with a higher flow rate being used with higher liquid temperatures and a lower flow rate being necessary for lower liquid temperatures due to the typically higher viscosity. It should also be clear that lower flow rates are one factor that can allow a higher delta T value. Where appropriate, this disclosure describes the settings used or the factors involved in selecting those settings.

The control requirements can be sharply reduced in applications which do not require active control. Passive applications, where self-heating is not occurring or where it is not being actively offset, do not require that a temperature control system react as quickly. Burn-in is another example of an application which often does not need active temperature control, because the functional tests which are run often do not dissipate enough power to induce self-heating.

B. Heat Sink Liquids

As previously mentioned, a heat sink is preferably kept at a relatively constant temperature below a set point temperature. The heat sink preferably has HFE7100, described earlier, flowing through a chamber.

Figure 8:
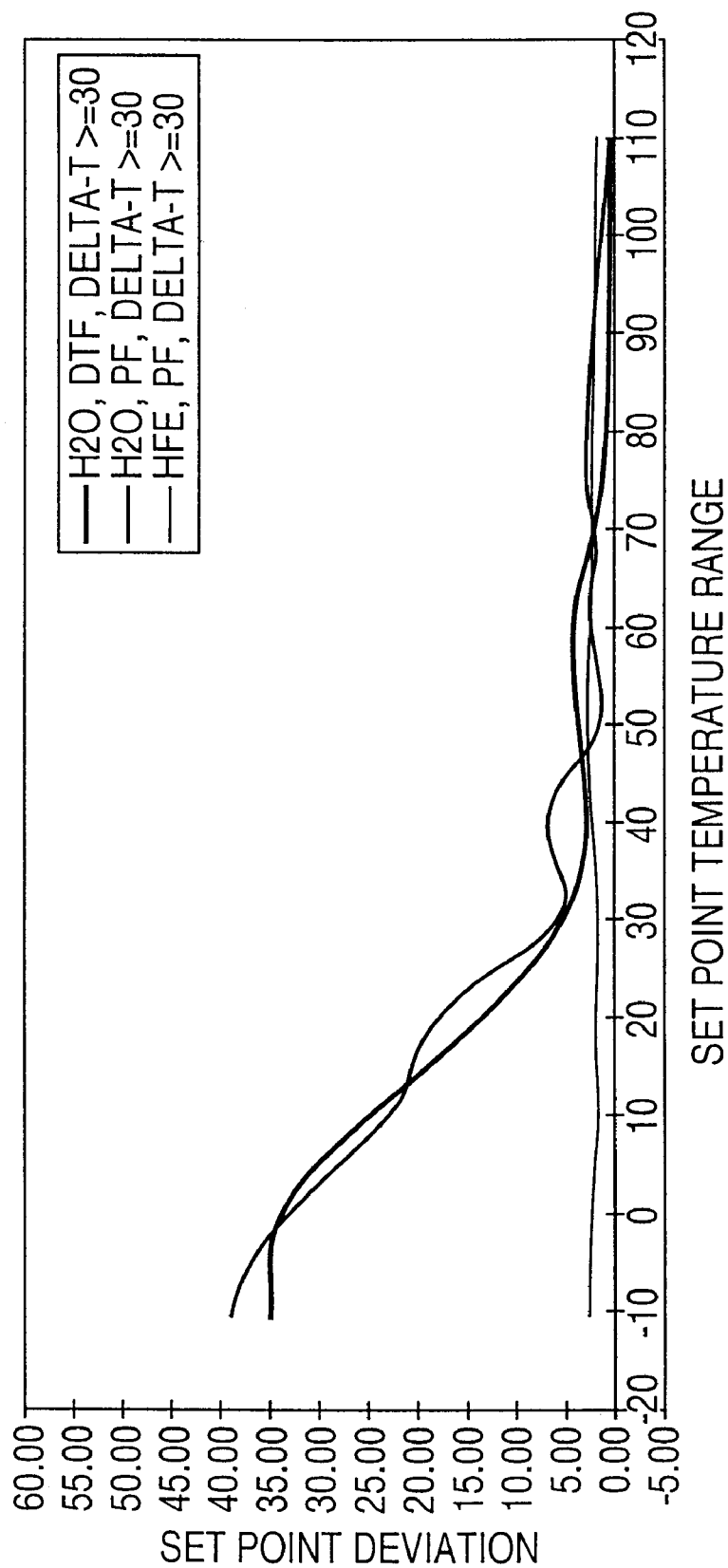
FIG. 8 contains a graph illustrating temperature control accuracy vs. set point.

FIG. 8 contains three curves which show the set point deviation as a function of set point temperature for three different systems. One system uses a water/methanol mixture of 40% water and 60% methanol as the heat sink liquid and uses direct temperature following as the control method. A second system also uses the same water/methanol mixture, but uses power following as the control method. A third system uses HFE7100 along with power following. The systems are attempting to control the temperature of a device under test. The DUT has a power usage which is rapidly changing between 0 and 25 watts/square cm.

The curves show that the water/methanol mixture begins to have problems at set points around 60 degrees C. and gets progressively worse at lower temperatures. The poor performance is encountered with both the direct temperature following and the power following control methods. The poor performance can be explained in part by the difficulty in chilling the water/methanol mixture below 0 degrees C., the relatively poor viscosity of the freezing water/methanol mixture, and the low temperature difference that results between the chilled water/methanol mixture and the set point. The low temperature difference becomes a problem, in part, because the system is unable to cool the DUT as quickly in response to self-heating, for example. This results in a greater deviation in the temperature of the DUT from the set point. This is to be contrasted with the performance of HFE7100 which maintains a set point deviation of less than approximately 4 or 5 degrees C. throughout the entire range of set point temperatures from −10 degrees C. to +110 degrees C.

The power dissipation through the heat exchanger heater increases with the set point-to-liquid temperature difference. Flow metering through the heat sink is used to optimize the power dissipation whenever possible. Flow metering can also be used to reduce the load on the heat exchanger heater, enabling higher temperatures at lower power dissipations. The limit to the flow metering is the heat-sink outlet temperature of the coolant, and any associated limits (e.g., exceeding the boiling point of the liquid at the system pressure). Decreasing the flow rate can allow a greater temperature between the liquid and the set point by decreasing the amount of heat that is drawn away from the heater. The heater is thus able to heat the DUT to a higher temperature. A particular embodiment has a maximum flow rate of 4 liters/minute and a heater power of 300 watts.

An embodiment of the present invention also enables a fast transition between different set points. Previous systems might require several hours to change between two different set points. The present invention enables this to be achieved in roughly 20–30 seconds between most set points. This reduction is due, in part, to the fact that the same equipment can be used for all set points of interest and the same liquid can be used in the heat sink chamber for all set points of interest. Further, the use of a heater along with a heat sink, and operating them at different temperatures, obviates the need for the heat sink liquid to move between the actual set points. This may offer an advantage if the liquid need only be moved over a smaller temperature range than the set point.

However, embodiments of the present invention can also move between set point temperatures by changing only the temperature of the liquid and not using the heater to effect the transition. Given that the same liquid is used for both set point temperatures, the system can still achieve the new set point temperature in a reduced time, as described above in the discussion on chillers.

Ideally, the control system will move the DUT temperature at the highest safe thermal expansion rate of the DUT and then clip the temperature at the set point. A linear, or trapezoidal, curve, with a slope indicative of a safe expansion rate is often desired in temperature profiles. This is as opposed, for instance, to an asymptotic approach to the desired temperature.

Figure 4:
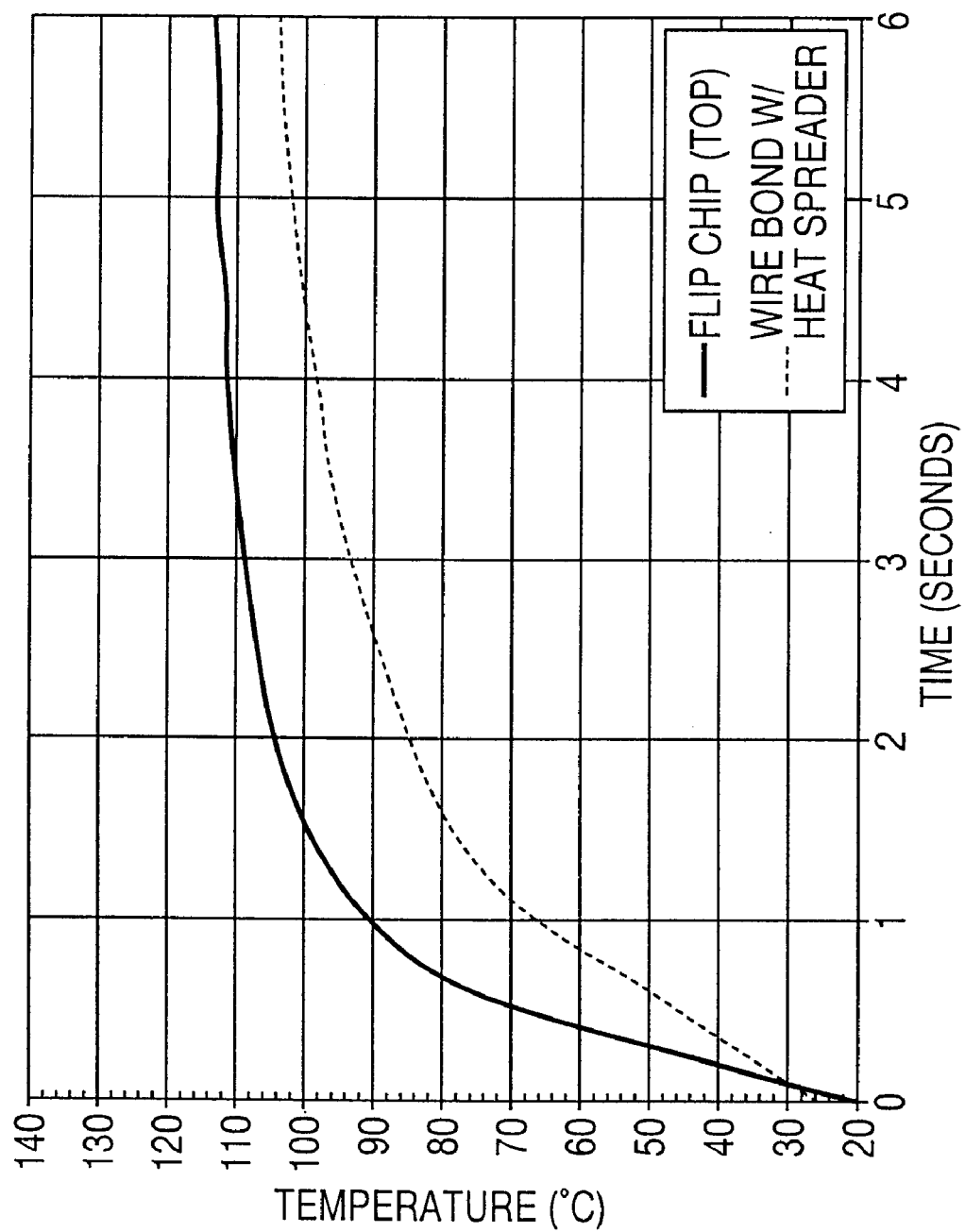
FIG. 4 illustrates a system changing the set point temperature of a test device, using the fast set point temperature change feature.

FIG. 4 contains two curves which show the temperature increase of two devices from approximately 20 degrees C. to at least 100 degrees C., for embodiments of the present invention. The flip chip moved from an ambient temperature of 20 degrees C. to a set point of 100 degrees C. in roughly 1.5 seconds, and to a set point of 110 degrees C. in roughly 3.5 seconds. The wire bond with heat spreader moved from an ambient temperature of 20 degrees C. to a set point of 100 degrees C. in roughly 4.5 seconds.

C. Delta T

The system's temperature control accuracy is partially dependent on the temperature difference between the set point and the liquid. FIG. 8 illustrates the temperature control accuracy of an HFE7100 based system versus a water/methanol based system. The water/methanol system has an accuracy fall-off at cold due to increasing viscosity inducing decreasing flow rate through the heat exchanger. HFE7100 has more consistent flow and viscosity across the liquid coolant temperature range. Although the HFE7100 will boil at approximately 60° C., the higher set point temperatures are achievable with the higher set point-to-liquid temperature differences. That is, the heater can add the required heat.

A higher temperature difference also gives the heater more room to operate in either overshooting or undershooting the desired set point temperature. If the temperature difference between the heat sink and the heater is low, then the heater may "bottom out" if it is desired to sharply reduce the heater power. Such a reduction may be needed, for example, to offset self-heating of the device under test.

Figure 9:
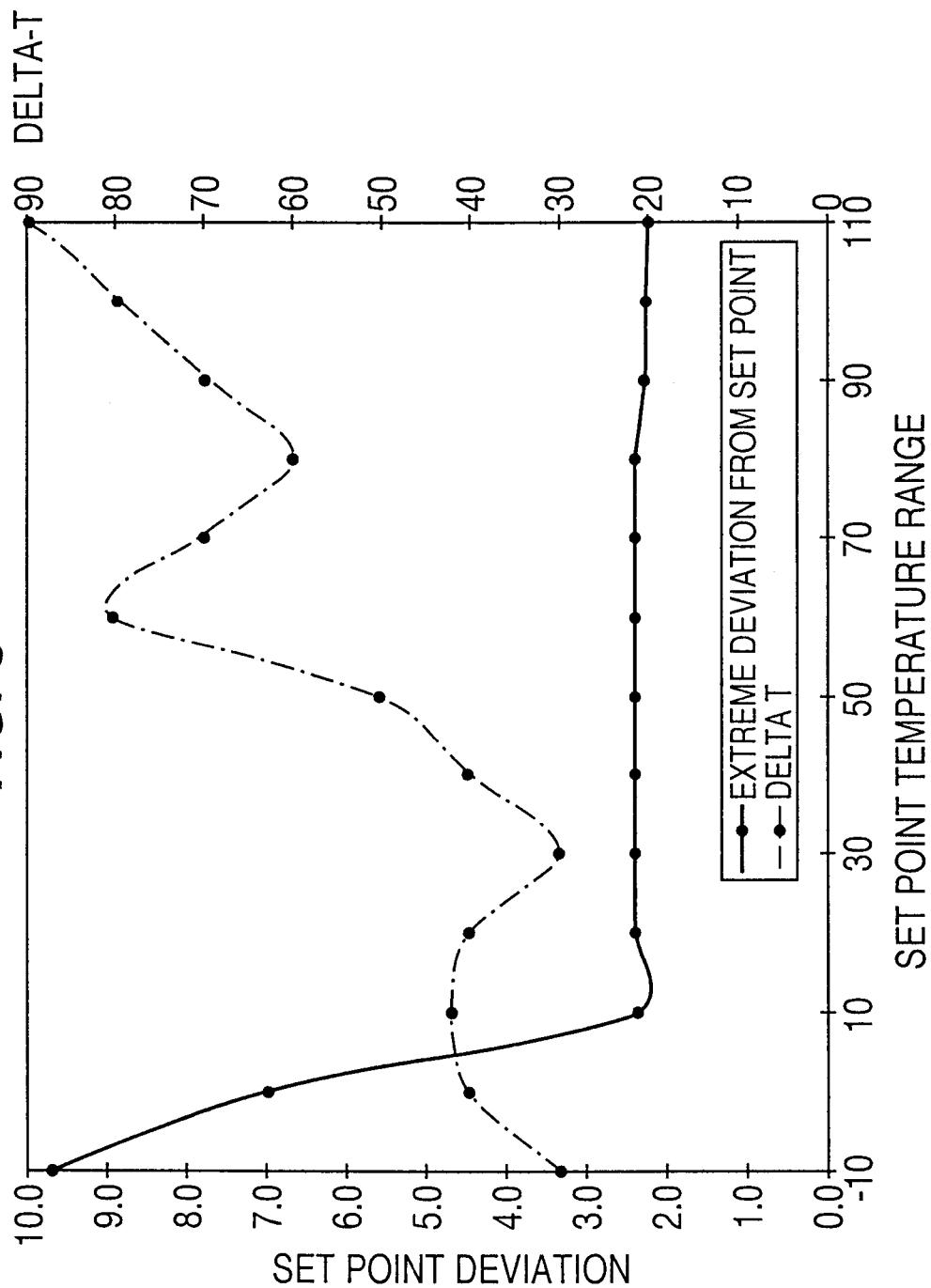
FIG. 9 contains a graph showing junction temperature vs. set point-to-liquid delta T.

FIG. 9 illustrates that the junction temperature accuracy is as good or better with higher set point-to-liquid temperature differences. With larger temperature differences, the set point can be changed rapidly with little impact on the achievable temperature control performance. The "Delta T" curve is created from the individual data points indicating the Delta T used at different set point temperatures. The "Extreme Deviation from Set Point" curve is created from the individual data points indicating the maximum deviation that occurred at the different set points. As can be seen from FIG. 9, as delta T is increased from approximately 30 degrees C., corresponding to a set point of approximately 30 degrees C., the deviation is relatively constant or decreasing. Much of the variation in the Delta T curve of FIG. 9 is caused by changes in the liquid temperature.

Figure 12:
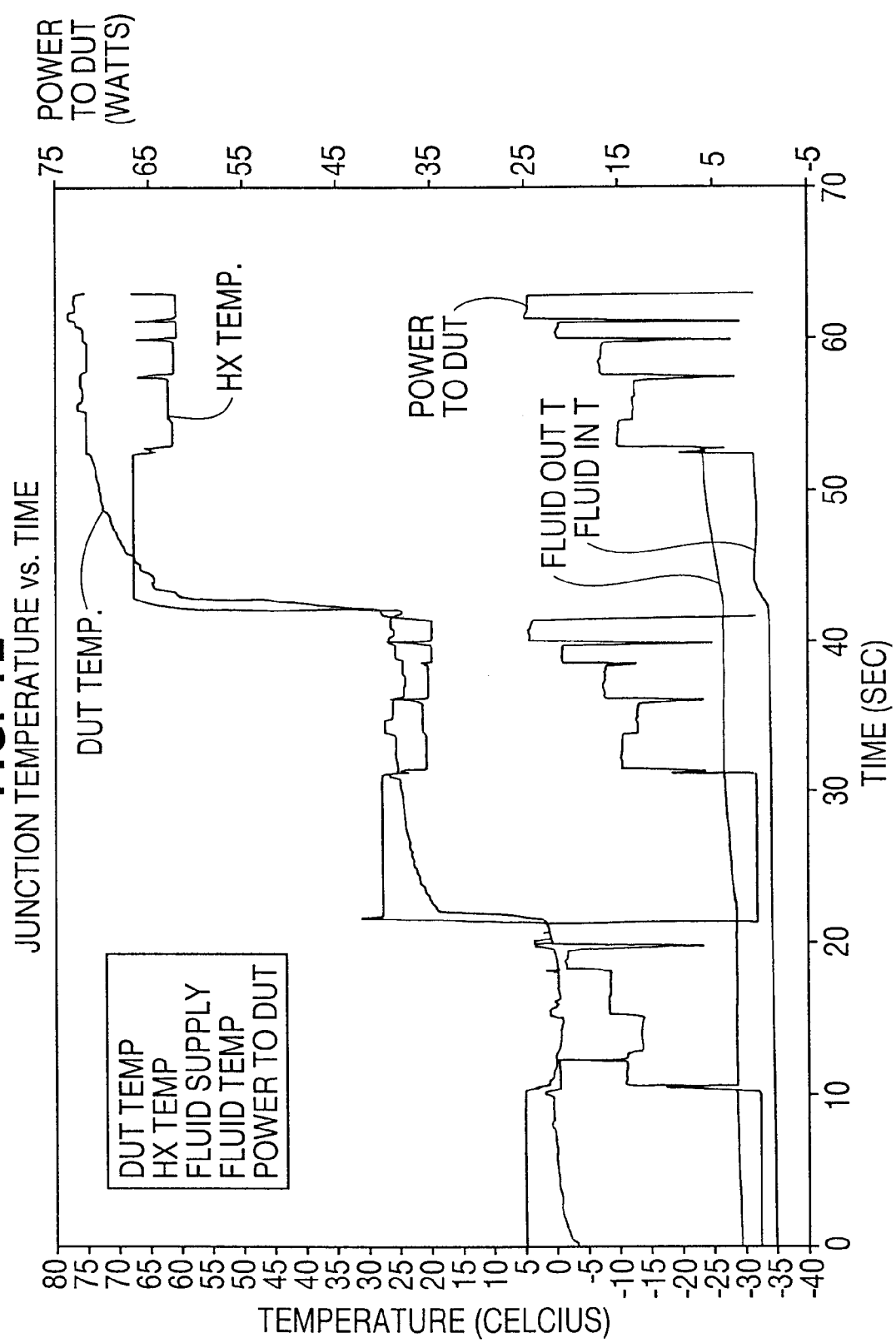
FIG. 12 contains a graph showing junction temperature vs. time.

FIG. 12 also illustrates another example of maintaining the temperature of the device under test ("DUT") at successively higher delta T's. In FIG. 12, delta T is the difference between the "Fluid In T" line and the "Hx Temp." line. The set points (not shown) are roughly 5, 30, and 70 degrees C. The "Power to DUT" curve shows that the DUT is drawing a variable amount of power and therefore experiencing fluctuating self-heating. The "HX Temp." curve shows how the heater power, and therefore temperature, is controlled to maintain the "DUT Temp." curve close to the desired set point. The "HX Temp." curve, in conjunction with the "Fluid In T" curve, also show how the set point is moved twice, at roughly 22 seconds and 42 seconds, simply by changing the heater power and without changing the temperature of the liquid.

The delta T range is variable based on several parameters. These parameters include the flow rate through a given heat sink design, the heat sink design itself, the maximum power level of the heater, the geometries of the heater and the DUT, and how much thermal load the DUT puts on the heater. In a typical application, 50 degree C. is a typical delta T value, but higher values are obtainable. Higher values can be obtained by adjusting the above, and other, parameters, such as by trimming down the coolant flow rate.

D. Profiles

Referring to FIG. 1, the system controller 14 executes software which interfaces to an operator via the operator interface terminal 12. The software includes the Windows NT operating system, Labview programming environment, and custom software developed to operate under Labview to perform the various functions of the system. A touch screen is used to simplify operation, but the keyboard/mouse interface is supported as well. A vocal input could also be used. It will be recognized that a variety of other software environments and user interfaces could be used.

Figure 5:
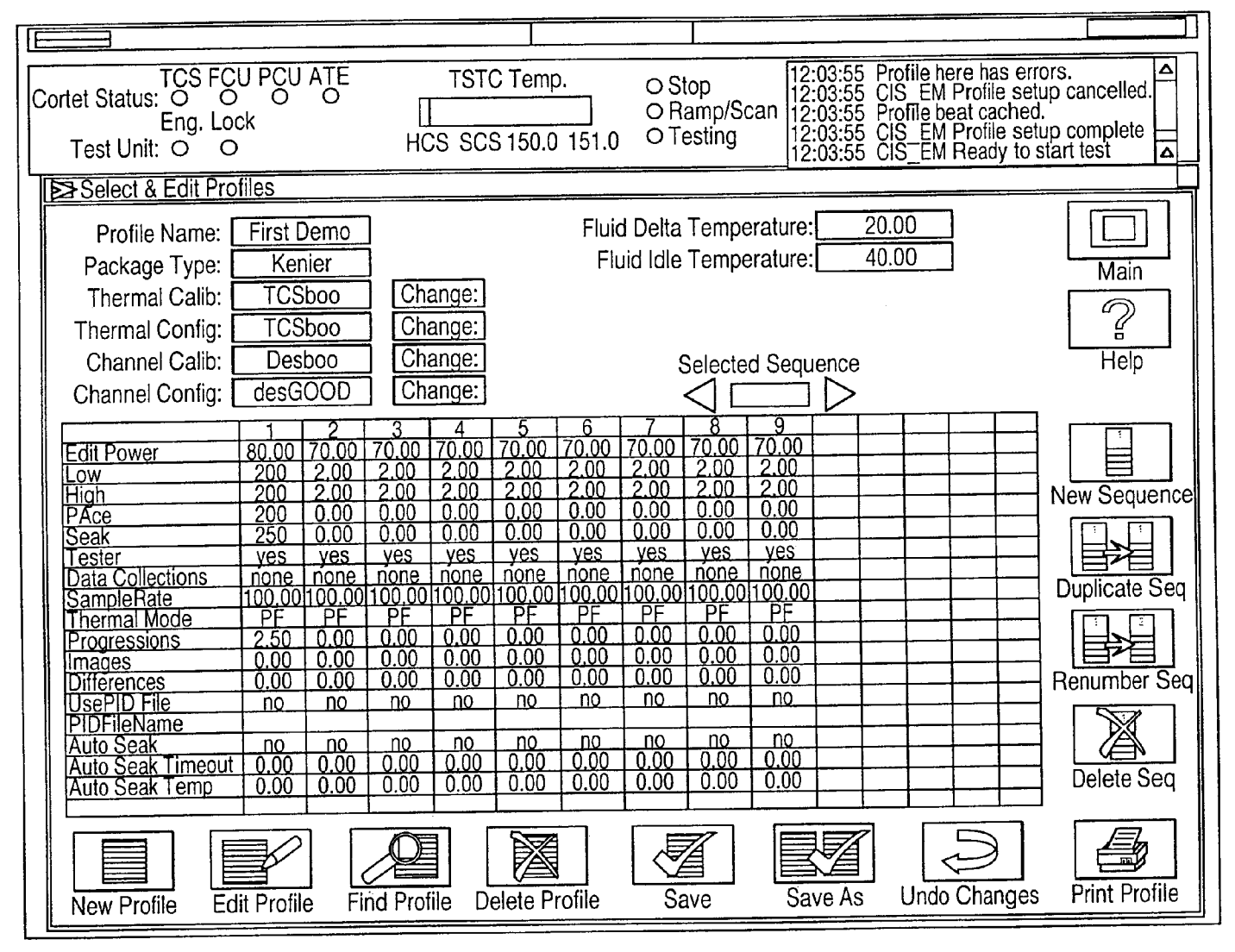

The software allows for "profiles" to be defined and stored. The profiles specify the forcing temperature, rate of change to the new temperature and how the profile is advanced. Typically, this can be either time related, or advanced by signals from an external source, such as automatic test equipment used to test the chip. FIG. 5 illustrates an example of the system software setup screens used to construct the profiles. The example profile indicates a sequence of nine set points for the DUT ranging from 70 degrees C. to 90 degrees C., allowable deviation of +/−2 degrees C., a temperature of 40 degrees C. for the liquid in the heat sink, a Delta T of 20 degrees C., and a thermal control mode of power following for each set point. The example profile includes a variety of other fields related to soak time, PID control, data collection, and DUT temperature ramp control.

The profiles can be programmed to cause the heater to overshoot or undershoot the desired set point in order to change the temperature of the DUT more quickly. The profiles can also be programmed to achieve the trapezoidal temperature curves described earlier.

The set point deviation can be characterized with a number of different methods. In many applications, the set point deviation is specified as being no greater than 3 degrees C. for power densities no greater than 20 watts/cm$^2$, and as being no greater than 5 degrees C. for power densities no greater than 30 watts/cm$^2$. That is, the actual temperature will be within +/−3 degrees, or +/−5 degrees, of the set point temperature. The actual figure depends on a variety of factors, including without limitation, whether the die is exposed or encased, the actual power density, and the thermal resistance of the die-heater boundary. In typical applications, the set point deviation is kept low enough such that results of a test of the DUT which determines $f_{max}$ at a set point temperature can be relied on as being accurate. The Jones application (provisional application Ser. No. 60/092,720 mentioned above has a more detailed discussion of fmax and its importance as a benchmark. Typically, an entire curve is determined by calculating $f_{max}$ at a variety of different temperature values. The set point deviation should be kept sufficiently low at each of the different temperature values so that each is a reliable figure.

E. Test Control and Temperature Determination

As described in the disclosure, a control system maintains the DUT temperature at a specified set point within a given tolerance. The control system must therefore have some information on the DUT temperature. Some control systems, such as direct temperature following, require constant DUT temperature information. Other control systems, such as power following, which control deviation from a set point, do not need constant DUT temperature information but only need to know when to begin the temperature maintenance process.

The maintenance, or deviation control, process often begins after the DUT has reached the set point temperature. This information may be determined indirectly, for example, after a soak timer has expired. It may also be determined directly, for example, by monitoring a thermal structure. Thermal structures can be used to supply initial DUT temperature information and they can also be monitored throughout the test if they are properly calibrated. One embodiment of the present invention monitors thermal structures to determine the initial DUT temperature before initiating a power following temperature control method.

Figure 13:
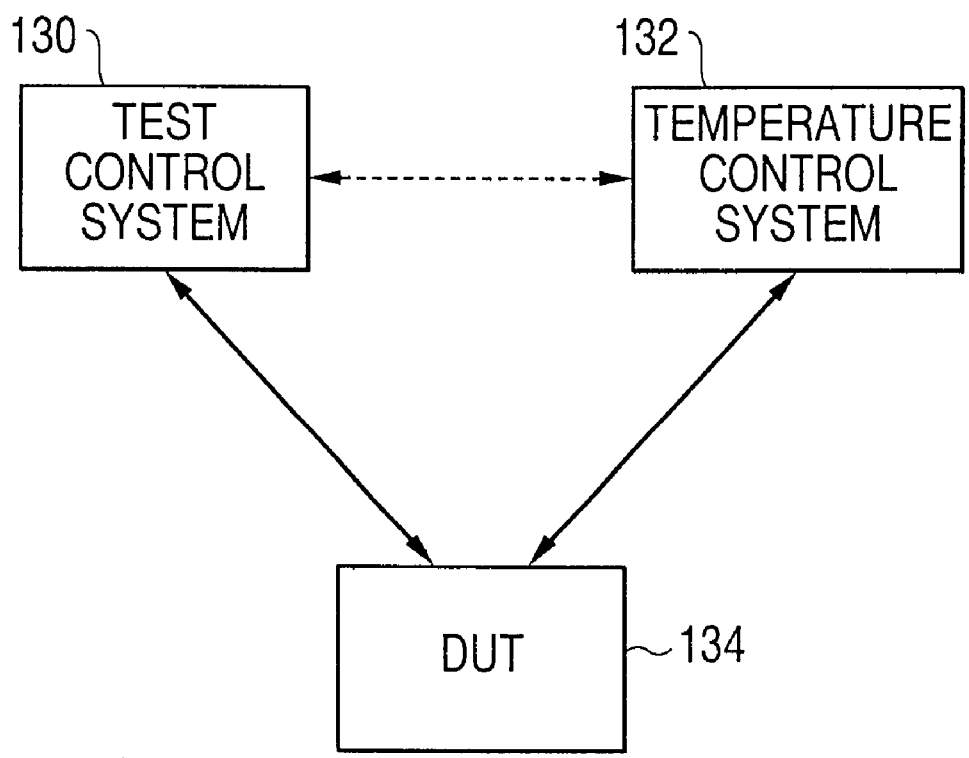
FIG. 13 is a high-level block diagram showing an interrelationship between a test control system, a temperature control system, and a DUT.
Figure 1:
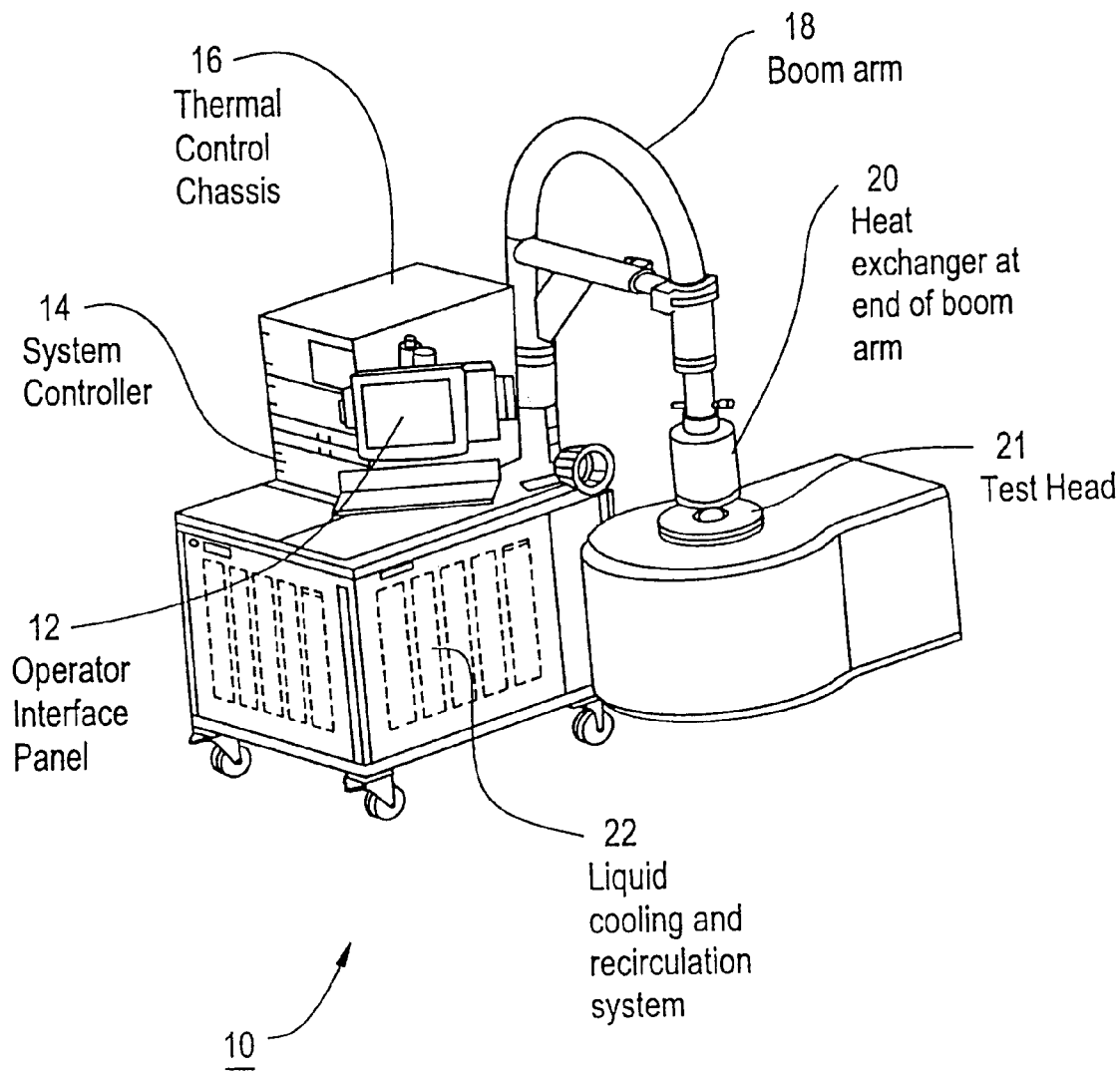

Embodiments of the present invention may include separate control sections to control the temperature and to control the test sequence. Referring to FIG. 13, there is shown a generic high-level block diagram illustrating a test control system 130 and temperature control system 132, both of which are connected to and communicate with a DUT 134. This disclosure has been primarily concerned with describing the temperature control system 132. The test control system 130 would operate the appropriate tests on the DUT 134 while the temperature control system 132 controlled the DUT temperature.

These two control systems 130, 132 need to communicate or otherwise coordinate their activities. Either the temperature control system 132 or the test control system 130 can monitor a thermal structure. In one embodiment of the present invention, the test control system 130 monitors the thermal structure of the DUT 134 and sends a signal, such as a scaled voltage, to the temperature control system 132 indicating the DUT temperature. FIG. 13 shows the communication path of such an embodiment with a dashed line between the test control system 130 and the temperature control system 132. Embodiments of the control systems and their architecture may vary considerably. In one embodiment, the two control systems 130, 132 are separate and have no direct communication. Both control systems 130, 132 monitor the DUT 134 to gain the necessary DUT temperature information in order to coordinate their activities. In a second embodiment, the two control systems 130, 132 are fully integrated.

3. Examples

One present embodiment uses HFE7100 as the liquid coolant, operating in the temperature range of −40° C. to +40° C. The temperature difference between the coolant supply and the chip set point temperature ranges between 5° C. and 160° C. The high temperature is limited by long term reliability issues associated with rapid, large, repeated temperature variations and associated thermal stresses of the coolant loop and the heater/heat exchanger assembly. It is also limited by the maximum set point to average liquid temperature difference sustainable with the power rating of the heater power supply. It is also limited by the materials and processes used to manufacture the heater/heat exchanger assembly, such as the breakdown temperature of an epoxy, the melting point of a solder, or the boiling point of a coolant. The current system calls for a chip set point temperature range of −35° C. to +125° C. This would require at least an 85 degree C. Delta T if the liquid coolant was at 40 degrees C. In practice, however, a larger Delta T is desired so that the heater can overshoot the desired temperature to achieve a faster response. One embodiment of the present invention uses an operating delta T of between approximately 5 degrees C. and approximately 100 degrees C.

A second embodiment uses water or a water/glycol (antifreeze) or water/methanol mixture, operating in the temperature range of +10° C. to +90° C. The temperature difference between the liquid and the chip set point temperature can range between 5° C. and 160° C. The chip set point temperature ranges between +15° C. to +170° C.

Another embodiment has a chiller temperature range of −40 degrees C. to 50 degrees C. The set point temperature is specified at 0 degrees C. to 110 degrees C. It can use the heater for active control, to compensate for self-heating of the DUT, from 40 degrees C. to 110 degrees C. The performance of the active control will degrade as the set point temperature approaches the coolant temperature. The amount of the degradation depends on the package type and the power density, among other things. Degradation is displayed in an increased die temperature deviation.

4. Variations

A heat exchanger may have many other implementations in addition to the embodiment described above. In particular, a heat exchanger need not include both a heater and a heat sink at the same time. Further, a heat exchanger may comprise, or even consist of, any device which either absorbs and/or supplies heat. A heat exchanger may include multiple heaters, laid side by side or stacked one on top of another, depending on the desired effect.

As one of ordinary skill in the relevant art will readily appreciate, in light of the present and incorporated disclosures, the functions of the overall system can be implemented with a variety of techniques. In accordance with an aspect of the present invention, the functionality disclosed herein can be implemented by hardware, software, and/or a combination of both.

Electrical circuits, using analog components, digital components, or a combination may be employed to implement the control, processing, and interface functions. Software implementations can be written in any suitable language, including without limitation high-level programming languages such as C++, mid-level and low-level languages, assembly languages, application-specific or device-specific languages, and graphical languages such as Lab View. Such software can run on a general purpose computer such as a Pentium, an application specific piece of hardware, or other suitable device. In addition to using discrete hardware components in a logic circuit, the required logic may also be performed by an application specific integrated circuit ("ASIC") or other device.

The system will also include various hardware components which are well known in the art, such as connectors, cables, and the like. Moreover, at least part of this functionality may be embodied in computer readable media (also referred to as computer program products), such as magnetic, magnetic-optical, and optical media, used in programming an information-processing apparatus to perform in accordance with the invention. This functionality also may be embodied in computer readable media, or computer program products, such as a transmitted waveform to be used in transmitting the information or functionality.

Further, the present disclosure should make it clear to one of ordinary skill in the art that the present invention can be applied to a variety of different fields, applications, industries, and technologies. The present invention can be used with any system in which temperature must either be monitored or controlled. This includes many different processes and applications involved in semiconductor fabrication, testing, and operation. The temperature of interest may be that of any physical entity, including, without limitation, an electronic device or its environment, such as air molecules either in a flow or stationary.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those of ordinary skill in the art without departing from the spirit and scope of the invention.

We claim:

1. An apparatus for controlling a temperature of a semiconductor device, the apparatus comprising:
   a heater, adapted to be thermally coupled to the semiconductor device;
   a heat sink thermally coupled to the heater, wherein the heat sink defines a chamber and the chamber is adapted to have a liquid flowing through the chamber; and
   a temperature control system, coupled to both the heater and the heat sink, for controlling a temperature of a point on either the heater or the semiconductor device;
   wherein the temperature control system is adapted to move the temperature of the point on the heater or the device from approximately a first set point temperature to approximately a second set point temperature by changing the control of the heater and maintaining at a substantially constant temperature the liquid flowing into the chamber, the liquid having an operative temperature range that extends as low as approximately −40 degrees C., and the operative set point temperatures extending as low as approximately −10 degrees C.

2. The apparatus of claim 1, wherein the first set point temperature is at least 25 degrees C. above the substantially constant temperature of the liquid flowing into the chamber.

3. The apparatus of claim 1, wherein the first set point temperature is below 35 degrees C. and the second set point temperature is above 65 degrees C.

4. The apparatus of claim 3, wherein the temperature control system moves the temperature of the point on the heater from approximately the first set point temperature to approximately the second set point temperature within five minutes.

5. The apparatus of claim 1, wherein the heater is adapted to be thermally coupled to the semiconductor device while the semiconductor device is in a socket.

6. The apparatus of claim 1, wherein the heater comprises a resistive heating element.

7. The apparatus of claim 1, wherein the heater is adapted to be disposed below the semiconductor device and adapted to be in thermally conductive contact with the semiconductor device.

8. The apparatus of claim 7, wherein the apparatus is adapted to force helium gas into a contact region between the heater and the semiconductor device.

9. The apparatus of claim 1, wherein the temperature control system comprises an analog circuit.

10. The apparatus of claim 1, wherein the liquid which the chamber is adapted to have flowing through the chamber comprises ethyl nonafluorobutylether and ethyl nonafluoroisobutylether.

11. The apparatus of claim 1, wherein the temperature control system is adapted to receive an input related to a temperature of a point on the semiconductor device.

12. The apparatus of claim 11, wherein the temperature control system is adapted to maintain the temperature of the point on the semiconductor device at approximately the first set point temperature despite potential fluctuations in the semiconductor device temperature caused by self-heating.

13. The apparatus of claim 11, wherein the temperature control system is adapted to maintain the temperature of the semiconductor device at approximately a set point temperature which is at least 50 degrees C. above a temperature of the liquid flowing into the heat sink.

14. The apparatus of claim 11, wherein the input related to the temperature of the semiconductor device which the temperature control system is adapted to receive is selected from a group consisting of a power profile for the semiconductor device, power consumption of the semiconductor device, current consumption of the semiconductor device, temperature of the semiconductor device, and a signal containing information from a thermal structure in the semiconductor device.

15. The apparatus of claim 12, wherein the temperature control system is adapted to control the temperature of the point on the semiconductor device to within +/−20 degrees C. of the first set point temperature despite potential fluctuations in the semiconductor device temperature caused by self-heating.

16. The apparatus of claim 12, wherein the temperature control system is adapted to maintain the temperature of the point on the semiconductor device at approximately the first set point temperature despite potential fluctuations in the semiconductor device temperature caused by self-heating, such that results of a test of the semiconductor device determining $f_{max}$ at the first set point temperature can be relied on as being accurate.

17. The apparatus of claim 14, wherein the temperature control system is adapted to maintain the temperature of the point on the semiconductor device at approximately the first set point temperature while the temperature of the liquid flowing into the chamber is maintained at approximately a constant temperature which is at least 25 degrees C. below the first set point temperature.

18. The apparatus of claim 1, wherein the apparatus is adapted to use a common liquid in the chamber of the heat sink for both set point temperatures, and wherein the control of the heater is adapted to remain substantially constant while the temperature control system moves the temperature of the liquid in the chamber.

19. The apparatus of claim 18, wherein:
the temperature control system is adapted to receive an input related to the temperature of the semiconductor device, and
the temperature control system is adapted to maintain temperature of the semiconductor device at approximately the first set point.

20. The apparatus of claim 18, wherein the temperature control system is adapted to control the heater so as to maintain the temperature of the semiconductor device at or near the first set point temperature, and at or near the second set point temperature, despite potential fluctuations in the semiconductor device temperature caused by self-heating.

21. The apparatus of claim 20, wherein the first set point temperature is less than −25 degrees C. and the second set point temperature is greater than 35 degrees C.

22. The apparatus of claim 1, wherein the temperature control system is adapted to move the temperature of the point on the semiconductor device by at least 50 degrees C. by controlling power sent to the heater and by controlling a temperature of a surface of the heat transfer unit.

23. The apparatus of claim 22, wherein:
the temperature control system is adapted to control a temperature of the liquid flowing into the chamber and thereby to control the temperature of the surface of the heat sink which contacts the incoming liquid.

24. The apparatus of claim 1, wherein the temperature control system is adapted to maintain a temperature of a point on the semiconductor device at or near a set point temperature despite the existence of self-heating of the semiconductor device and is adapted to provide the control of the temperature of the point on the semiconductor device by changing a temperature of the heater and maintaining a temperature of a surface of the heat sink at an approximately constant temperature.

* * * * *

UNITED STATES PATENT AND TRADEMARK OFFICE
CERTIFICATE OF CORRECTION

PATENT NO.    : 6,389,225 B1  Page 1 of 2
DATED         : May 14, 2002
INVENTOR(S)   : Mark F. Malinsoki et al.

It is certified that error appears in the above-identified patent and that said Letters Patent is hereby corrected as shown below:

Drawing sheet 1 of 13 consisting of Fig. 1 is deleted and replaced with drawing sheet 1 of 13 consisting of Fig. 1 as shown on the attached page.

Signed and Sealed this

Fourteenth Day of March, 2006

JON W. DUDAS
*Director of the United States Patent and Trademark Office*